United States Patent
Matsumoto

(10) Patent No.: US 6,369,411 B2
(45) Date of Patent: Apr. 9, 2002

(54) SEMICONDUCTOR DEVICE FOR CONTROLLING HIGH-POWER ELECTRICITY WITH IMPROVED HEAT DISSIPATION

(75) Inventor: Hideo Matsumoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/757,630

(22) Filed: Jan. 11, 2001

Related U.S. Application Data

(63) Continuation of application No. PCT/JP99/02417, filed on May 11, 1999.

(51) Int. Cl.⁷ .............................................. H01L 31/111
(52) U.S. Cl. ...................... 257/182; 257/179; 257/180; 257/181; 333/247
(58) Field of Search .................... 257/712–14, 718, 257/728, 794, 788–791, 782, 698, 700, 730, 732, 150, 177–182, 701, 702, 704, 706, 707; 333/247

(56) References Cited

U.S. PATENT DOCUMENTS

| | | | |
|---|---|---|---|
| 5,471,089 A | * 11/1995 | Nagatomo et al. | .......... 257/691 |
| 5,646,445 A | 7/1997 | Masumoto et al. | |
| 5,698,898 A | 12/1997 | Matsumoto | |

FOREIGN PATENT DOCUMENTS

| | | | |
|---|---|---|---|
| JP | 04273451-a | * 9/1992 | |
| JP | 7-66340 | 3/1995 | |
| JP | 9-22973 | 1/1997 | |

* cited by examiner

*Primary Examiner*—Minh Loan Tran
*Assistant Examiner*—Thomas L Dickey
(74) *Attorney, Agent, or Firm*—Oblon, Spivak, McClelland, Maier & Neustadt, P.C.

(57) ABSTRACT

A semiconductor device including (a) a base plate, (b) an insulation substrate including of an insulator plate with a front electrode and a back electrode bonded thereon and fixed onto the base plate by the back electrode, (c) a semiconductor element fastened onto the insulation substrate by the front electrode, (d) an insulating cover covering the semiconductor element, and (e) electrodes that are led from the semiconductor element to the outside of the insulating cover. The back electrode is larger than the insulator plate, and the base plate has a through hole that is smaller than the back electrode and larger than the insulator plate. The insulation substrate is positioned in the through hole and is fastened onto the back surface of the base plate by the periphery of the back electrode. The insulation substrate can make direct contact with a heat sink without the base plate intervening therebetween, and thereby thermal resistance between the semiconductor element and the heat sink is decreased. Also, bending stress to be generated in the insulator plate when fastening the heat sink onto the base plate by screwing is mitigated by the back electrode, and thereby dielectric breakdown in the semiconductor device due to cracks in the insulator plate can be restrained from taking place.

20 Claims, 3 Drawing Sheets

SEMICONDUCTOR DEVICE FOR CONTROLLING HIGH-POWER ELECTRICITY WITH IMPROVED HEAT DISSIPATION

CROSS-REFERENCE TO RELATED APPLICATIONS

This application is a continuation application of PCT international application No. PCT/JP99/02417 which has an international filing date of May 11, 1999, which designated the United States, the entire contents of which are hereby incorporated herein by reference.

BACKGROUND OF THE INVENTION

Field of the Invention

The present invention relates to a semiconductor device used for controlling high-power electricity and, more particularly, to improvements in the insulation and heat dissipation scheme of a semiconductor device used for controlling high-power electricity.

Discussion of the Background

Semiconductor devices capable of controlling high-power electricity are used in industrial equipment in such fields as traffic control systems and motor control systems. For such semiconductor devices, it is necessary to ensure satisfactory electrical insulation and heat dissipation.

A semiconductor device for controlling high-power electricity in the background art may have a structure as shown in FIG. 7.

In FIG. 7, a semiconductor element 1 is bonded to an insulation substrate 3 by a solder 2, and the insulation substrate 3 is bonded to a base plate 6 made of copper by means of a solder 5 via a back electrode 32. The insulation substrate 3 is formed by bonding a front electrode 4, including front electrode elements 41, 42, and the back electrode 32 on the respective sides of an insulator plate 31. The semiconductor element 1 and the insulation substrate 3 are covered by an insulating cover 11, while a space below the insulating cover 11 is filled with a gel 9 injected through an opening 11a which is sealed by an epoxy resin 10. An emitter electrode of the semiconductor element 1 is connected via front electrode element 41 and conductor 7 to a main electrode 81, while a collector electrode is connected via an aluminum wire 14 and front electrode element 42 to a main electrode 82.

The semiconductor device is used by connecting lead wires from an external circuit to the main electrodes 81, 82 by means of nuts 12 and installing a heat sink (not shown) to the base plate 6 by means of screws and set holes 13. Heat generated from the semiconductor element 1 by electric current supplied from the external circuit is transferred to the heat sink via the insulation substrate 3 and the base plate 6. In order to decrease the thermal resistance between the semiconductor element and the heat sink, an entire surface of the insulation substrate 3 is secured onto the base plate 6 by the solder 5. A heat conductive grease is generally applied to the interface between the base plate 6 and the heat sink.

The semiconductor device of the background art of FIG. 7, however, has the following problems.

In a process of manufacturing the semiconductor device, the insulation substrate 3 and the base plate 6 are heated to a melting point of the solder 5 and are then cooled down. Since a thermal expansion coefficient the base plate 6, which is made of copper, is about four times larger than that of the insulator plate 31 that is made of ceramics, the base plate 6 and the insulation substrate 3 are subject to different degrees of expansion and contraction. As a result, the base plate 6 that is bonded to the insulation substrate 3 warps to become convex on the top surface during the cooling process. As the base plate 6 warps, a gap is generated between the base plate 6 and the heat sink. This increases the thermal resistance between the base plate 6 and the heat sink, thus leading to decreased efficiency of heat dissipation from the semiconductor element 1.

Also, when semiconductor element 1 is heated/cooled during soldering, or when the temperature around the semiconductor 1 is increased/decreased by turning on/off the power supply to the semiconductor device, the solder 5 interposed between the base plate 6 and the insulation substrate 3 that have different thermal expansion coefficients is subjected to a stress. This stress tends to generate cracks in the solder 5 or in the bonding interface thereof. When cracks are generated in the solder 5 or the interface thereof, the thermal resistance between the insulation substrate 3 and the base plate 6 increases, thus leading to a decrease in the efficiency of heat dissipation from the semiconductor element 1.

Moreover, when the heat sink is screwed onto the base plate 6, a bending stress is generated in the base plate 6 and the insulation substrate 3 because the mating surfaces are not completely flat. The bending stress becomes particularly significant when the base plate 6 and the insulation substrate 3 are deformed to warp. If the insulator plate 31 made of ceramics breaks due to the bending stress, the semiconductor element 1 experiences dielectric breakdown.

SUMMARY OF THE INVENTION

The present invention has been made to address the above-described and other problems, and an object of the present invention is to provide a novel semiconductor device that has a low thermal resistance between a semiconductor element and a heat sink and that is capable of restraining the occurrence of dielectric breakdown in the semiconductor element due to cracks in an insulator plate.

In order to achieve the objects described above, the semiconductor device of the present invention includes (a) a base plate, (b) an insulation substrate including an insulator plate with a front electrode and a back electrode bonded thereto and fixed onto the base plate by the back electrode, (c) a semiconductor element fixed onto the insulation substrate and the front electrode, (d) an insulating cover covering the semiconductor element, and (e) electrodes led from the semiconductor element to the outside of the insulating cover. The base substrate also has a through hole which is smaller than the back electrode and is larger than the insulator plate, and the insulation substrate is placed in the through hole and is fixed onto the back surface of the base plate by the periphery of the back electrode.

The semiconductor device of the present invention is used with a heat sink secured onto its base plate, similarly as in the background art. However, unlike the background art, the insulation substrate makes direct contact with the heat sink, without the base plate intervening therebetween. Consequently, heat generated in the semiconductor element is transmitted from the insulation substrate directly to the heat sink, resulting in reduced thermal resistance between the semiconductor element and the heat sink.

Also, because the insulation substrate makes contact with the base plate only on the periphery of the back electrode placed on the back thereof, deformation due to the difference in thermal expansion coefficients between the insulation substrate and the base plate hardly occurs.

Moreover, the bending stress generated in the insulator plate when fixing the heat sink onto the base plate by screwing is mitigated by the back electrode. As a result, isolation between the back electrode and the front electrode due to cracks in the insulator plate can be prevented.

In the semiconductor device of the present invention, it is preferable that the back electrode is thicker than the front electrode. With such a configuration, as the temperature of the semiconductor device rises, the insulation substrate deforms to become convex on the bottom side due to the difference in stress generated on the front electrode side and the back electrode side. Such a deformation of the insulation substrate on the bottom surface becoming convex improves the close contact between the insulation substrate and the heat sink. As a result, the thermal resistance between the semiconductor element and the heat sink decreases as the temperature of the semiconductor device rises, thus leading to improved efficiency of heat dissipation.

Further according to the present invention, various materials may be used to make the base plate since the base plate does not take part in the thermal resistance. The base plate is preferably made of, for example, a plastic material that would reduce the weight of the semiconductor device.

Also, the base plate and the insulation substrate may be made of the same material while molding the base plate and the insulating cover in an integral body. By molding the base plate and the insulating cover in an integral body, construction of the semiconductor device can be simplified and the manufacturing cost can be reduced.

The semiconductor device of the present invention may also be provided with a base plate including a plurality of through holes therein. The individual insulating substrates with semiconductor elements fixed thereon are secured in the plurality of through holes. With this configuration, heat generated by the plurality of semiconductor elements can be dissipated through a common heat sink.

Alternatively, the base plate may be divided into a plurality of segments so that through holes are formed by proper arrangement of the segments. This configuration simplifies the construction of the semiconductor device and reduces the manufacturing cost.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
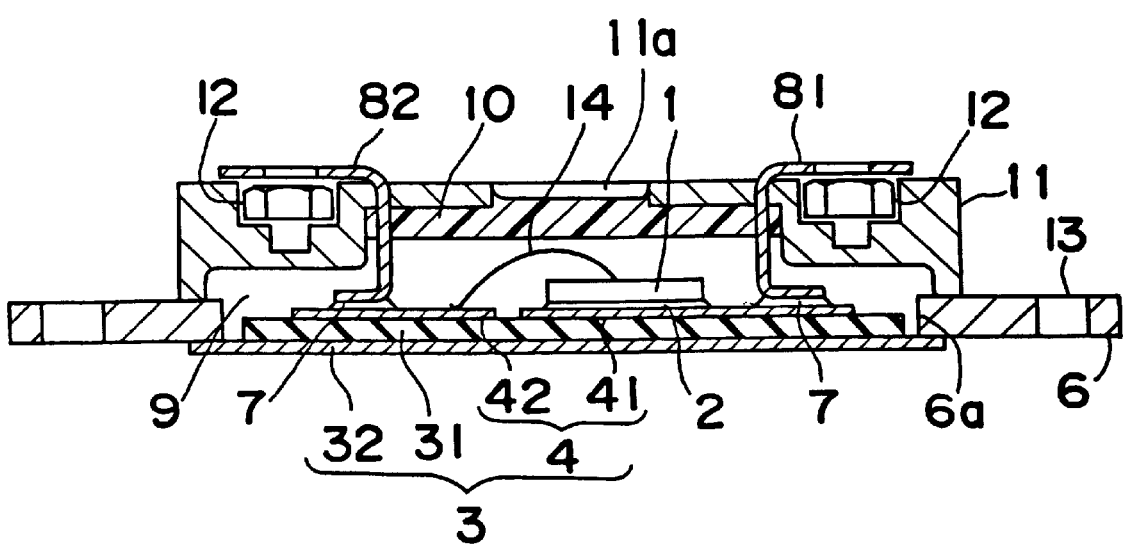
FIG. 1 is a sectional view showing a semiconductor device according to a first embodiment of the present invention.

Preferred embodiments of the present invention will be described below with reference to the accompanying drawings in which like reference numerals indicate identical or corresponding elements throughout the several views.

FIG. 1 is a sectional view showing a semiconductor device according to a first embodiment of the present invention. A semiconductor element 1 is bonded onto an insulation substrate 3 by a solder 2. The insulation substrate 3 is made by bonding front electrodes elements 41, 42 made of a material such as copper or aluminum, to an insulator plate 31 made of aluminum nitride or the like. The back electrode 32 is formed to be larger than the insulator plate 31.

Formed in the base plate 6 is a through hole 6a that is smaller than the back electrode 32 and is larger than the insulator plate 31. The insulation substrate 3 is positioned in the through hole 6a and is fixed onto the back surface of the base plate 6 by the periphery of the back electrode 32. According to the present invention, since the thermal resistance between the insulation substrate 3 and the base plate 6 causes no problem, the insulation substrate 3 can be fixed onto the base plate 6 by various methods such as an adhesive or welding, as well as soldering.

The semiconductor element 1 and the insulation substrate 3 are covered by an insulating cover 11 as in the background art. The insulating cover 11 may be, for example, a molding made of a plastic material such as PPS. A space below the insulating cover 11 is preferably filled with a gel 9 injected through an opening 11a in order to improve the electrical insulation. In order to improve the moisture resistance of the semiconductor device, the opening 11a is preferably sealed with an epoxy resin 10. The semiconductor element 1 and the insulation substrate 3 may also be enclosed with an insulating cover, e.g., by molding a resin directly over the semiconductor element 1 and the insulation substrate 3.

An emitter electrode of the semiconductor element 1 is connected to the front electrode element 41 with the solder 2, while a collector electrode of the semiconductor element 1 is connected via an aluminum wire 14 to a front electrode element 42. The front electrode elements 41, 42 are connected to an emitter main electrode 81 and a collector main electrode 82, respectively, that are led out of the insulating cover 11.

The semiconductor device of the present invention is also used with installing a heat sink (not shown) attached to the base plate 6 by means of screws and set holes 13. Since the insulation substrate 3 is not covered by the base plate 6 but is exposed and protrudes beyond the bottom surface of the base plate 6, the insulation substrate 3 makes direct contact with the heat sink. In order to improve the heat transmission, a heat conductive grease is preferably applied between the insulation substrate 3 and the heat sink. Heat generated from the semiconductor element 1 by the electric current supplied from the external circuit is transmitted to the heat sink via only the insulation substrate 3. As a result, the thermal resistance between the semiconductor element 1 and the heat sink can be made lower than that of the construction of the background art in which the heat is transmitted through the insulation substrate 3, the solder 5, and the base plate 6.

The insulation substrate 3 makes contact with the base plate 6 only on the periphery of the back electrode 32 that is provided on the back thereof. Consequently, deformation due to the difference in thermal expansion coefficients between the insulation substrate 3 and the base plate 32 hardly occurs.

Moreover, although the insulator plate 31 is also subject to the bending stress transmitted through the back electrode 32 when the heat sink is screwed onto the base plate 6, the bending stress acting in the insulator plate 31 is mitigated because the back electrode 32 is thin and is therefore flexible. Thus, cracking of the insulator plate 31 is restrained from occurring.

Figure 2:
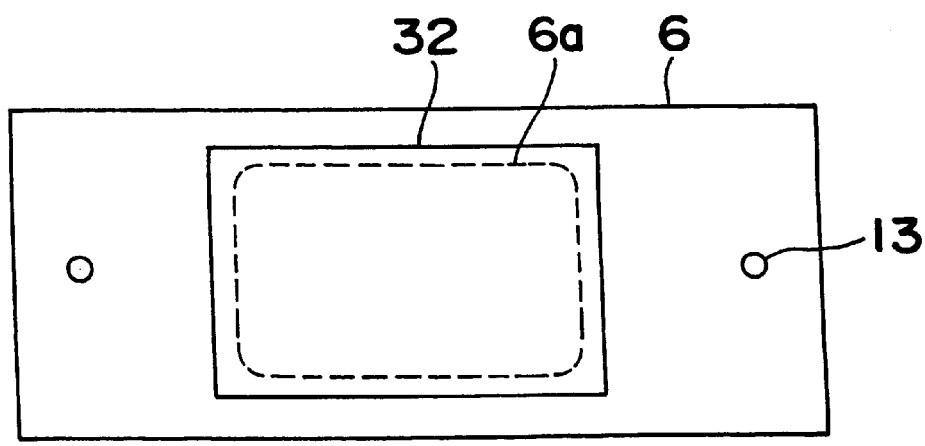
FIG. 2 is a bottom view showing the semiconductor device according to the first embodiment of the present invention.

FIG. 2 is a bottom view of the semiconductor device shown in FIG. 1. In the semiconductor device of the present invention, since the back electrode 32 that is bonded with the back face of the insulation substrate 3 protrudes beyond the base plate 6, almost only the back electrode 32 touches the heat sink. This results in a smaller contact area between the semiconductor device and the heat sink than in the background art. As a result, even when the heat sink is fixed by screwing with the same tightening torque as in the background art, higher contact pressure than in the background art is achieved between the heat sink and the semiconductor device, thus reducing the thermal resistance.

For the purpose of reducing the thermal resistance between the semiconductor element and the heat sink when the temperature is high, it is desirable to make the back electrode 32 thicker than the front electrode 4. When a temperature of the semiconductor device rises, stress is transmitted from the front electrode 4 and the back electrode 32 to the insulator plate 31 due to the difference in the thermal expansion coefficient between the front electrode 4 or the back electrode 32 and the insulator plate 31. Since the magnitude of the stress varies depending on the thickness of the electrode, the stress transmitted from the back electrode 32 is greater than the stress transmitted from the front electrode 4. As a consequence, the insulation substrate 3 deforms to become convex on the bottom surface when the temperature rises. When the insulation substrate 3 deforms to become convex on the bottom surface, close contact between the insulation substrate 3 and the heat sink improves so that the thermal resistance between the semiconductor element and the heat sink decreases. Thus, the effect of decreasing the thermal resistance at high temperatures, where heat dissipation is more needed, can be achieved.

Figure 7:
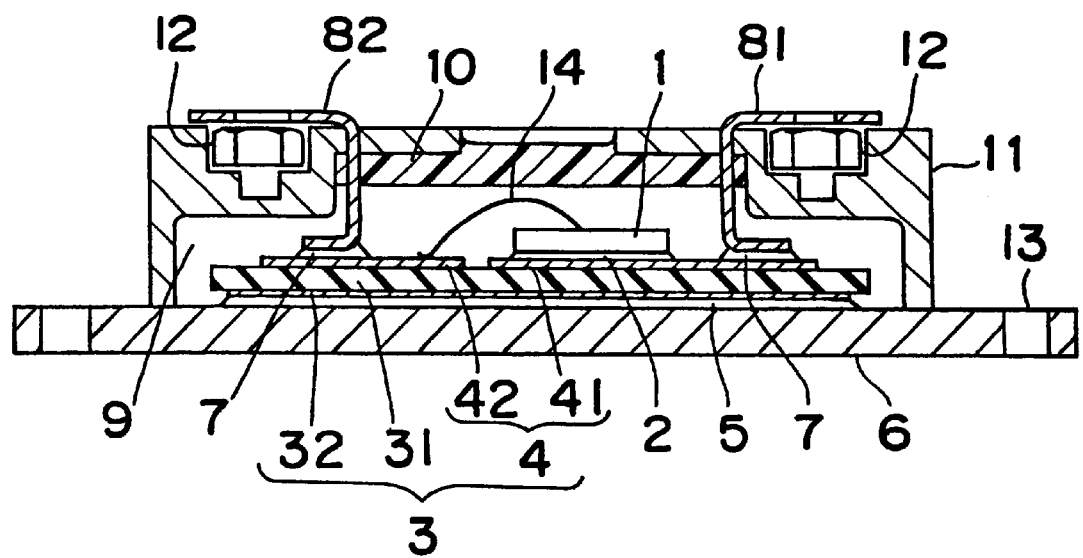
FIG. 7 is a sectional view showing a semiconductor device of the background art.

In the structure of the background art shown in FIG. 7, an effect similar to the above cannot be achieved even when the back electrode is made thicker than the front electrode. This is because the insulation substrate 3 is soldered onto the base electrode 6, that has high rigidity, over the entire surface thereof. This makes it less likely to occur to deform due to the difference in thickness of the electrodes.

In the semiconductor device of the present invention, the base plate 6 does not take part in the heat dissipation from the semiconductor element 1 and therefore may be made of various materials. For example, the base plate 6 may be made of steel that is less expensive than copper. The base plate 6 may also be made of a plastic material to thereby reduce the weight of the semiconductor device.

Figure 3:
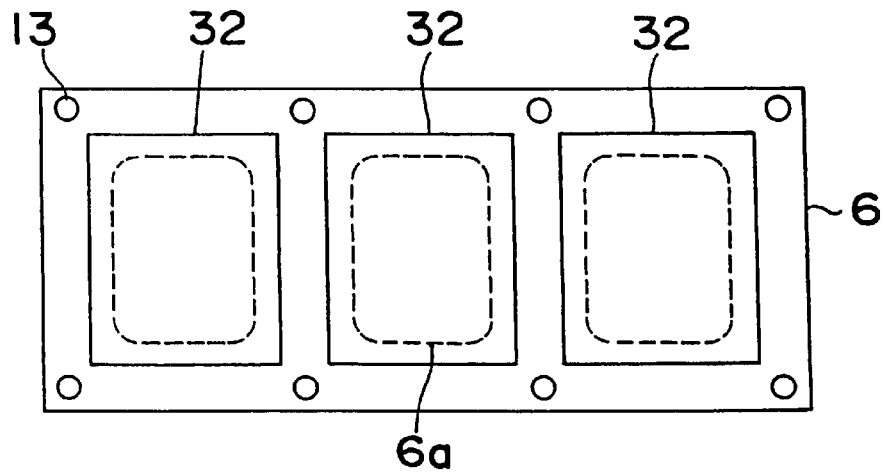
FIG. 3 is a bottom view showing a semiconductor device according to a second embodiment of the present invention.

FIG. 3 is a bottom view of the semiconductor device according to a second embodiment of the present invention. In the semiconductor device of this embodiment, a plurality of semiconductor elements are mounted in a single package. For example, three through holes 6a are made in the single base plate 6. Insulation substrates each carrying a semiconductor element secured thereon are fastened in the through holes 6a by respective back electrodes 32. This construction makes it possible to use a common heat sink for the three semiconductor elements. Thus, the required number of heat sinks can be reduced and the operation to set the heat sink can be simplified.

Figure 4:
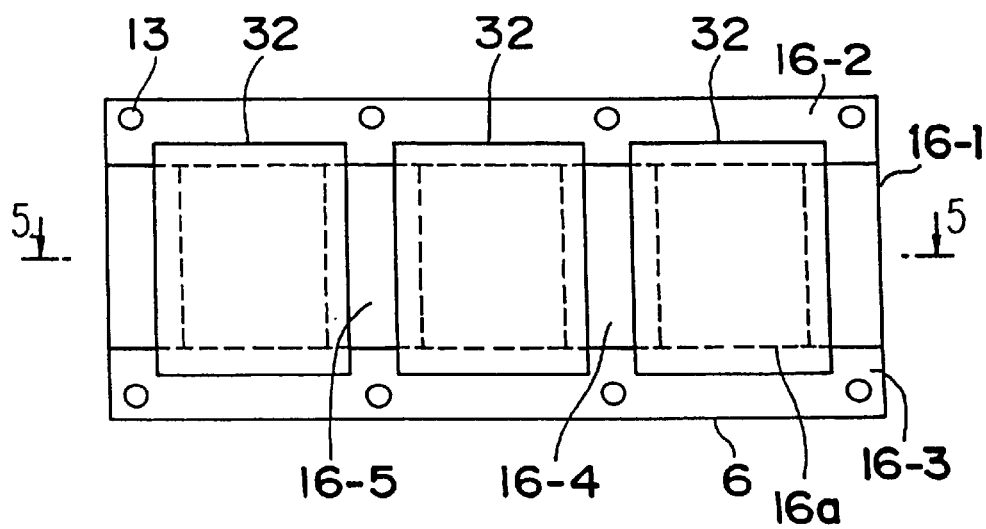
FIG. 4 is a bottom view showing a semiconductor device according to the third embodiment of the present invention.
Figure 5:
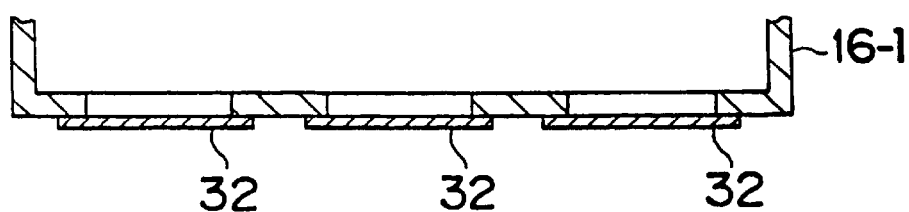
FIG. 5 is a sectional view showing the semiconductor device according to the third embodiment of the present invention.

FIG. 4 and FIG. 5, respectively, are a bottom view of the present invention and a sectional view of the semiconductor device of a third embodiment of the present invention, respectively. In FIG. 5, all components other than a base plate 16 that also serves as an insulating cover and the back electrode 32 are omitted.

In the semiconductor device of this embodiment, too, a plurality of semiconductor elements are mounted in a single package similarly to the second embodiment. In this embodiment, the base plate 16 is divided into a plurality of segments and through holes 16a are formed by proper arrangement of the segments. For example, the base plate 16 is divided into five segments of 16-1 through 16-5 as shown in FIG. 4. Such a division of the base plate 16 makes the configuration of the base plate simpler, and molding of the base plate easier.

Further, in this embodiment, the base plate and the insulating cover are molded in an integral body. Since the material to make the base plate can be selected from a wide variety as mentioned earlier, the base plate and the insulating cover can be molded integrally from the same material. Molding the base plate and the insulating cover in an integral body makes it possible to reduce the number of components of the semiconductor device and reduce the manufacturing cost. For example, as shown in FIG. 5, the base plate and the insulating cover may be molded in an integral body so that the side wall of the insulating cover continues to the base plate. The base plate segments 16-1 through 16-3 are integrated with the insulating cover at the corresponding portions. In order to prevent the gel that fills in the space below the insulating cover from coming out, components are preferably bonded with a silicone rubber adhesive or the like after assembling the segments 16-1 through 16-5.

In this embodiment, the base plate is divided, and then the divided base plate segments are molded to form an integral body with the insulating cover. However, the base plate and the insulating cover may be formed from a single molding without dividing the base plate.

Figure 6:
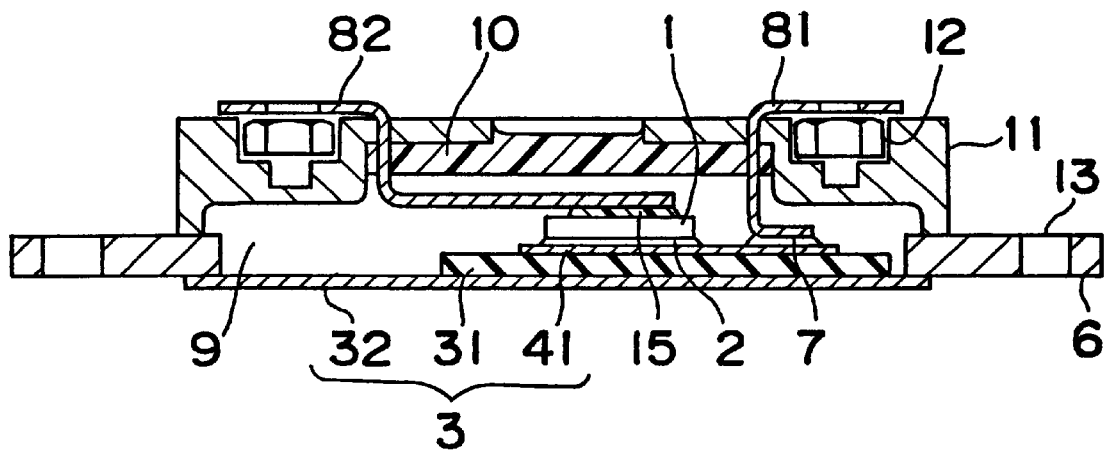
FIG. 6 is a sectional view showing a semiconductor device according to a fourth embodiment of the present invention.

FIG. 6 is a sectional view showing a further embodiment of the present invention in which the semiconductor element 1 and the main electrode 82 are connected in a different way. In this embodiment, the collector electrode of the semiconductor element 1 is connected directly to the main electrode 82, not by a front electrode. The connection may be made, for example, by using an electrically conductive adhesive. With this configuration, since a front electrode is not necessary in a region where the collector electrode is connected, an area of the insulator plate 31 can be decreased. That is, a ratio in the surface area of the insulator plate 31 to the back electrode 32 can be decreased. As the relative area of the insulator plate 31 that has higher rigidity is decreased, the back electrode 32 is made more flexible and close contact between the back electrode 32 and the heat sink becomes easier to achieve.

While the present invention has been described in full detail above by way of preferred embodiments with reference to the accompanying drawings, it will be apparent to those skilled in the art that various modifications and alterations can be made without departing from the spirit of the invention. It should be understood that all such modifications and alterations fall within the scope of the present invention as defined in the appended claims.

What is claimed is:

1. A semiconductor device comprising:
  (a) a base plate having a portion extending in a longitudinal direction and including a through hole through the portion extending in the longitudinal direction;

(b) an insulation substrate including an insulator plate with a front electrode and a back electrode bonded thereon, the insulation substrate being fixed onto said base plate by said back electrode;

(c) a semiconductor element fixed onto said insulation substrate by said front electrode;

wherein said back electrode is larger than said insulator plate, and the through hole of said base plate is smaller than said back electrode and larger than said insulator plate; and wherein said insulation substrate is placed in the through hole and is fixed onto the back surface of said base plate by a periphery of said back electrode.

2. A semiconductor device according to claim 1, further comprising:

(d) an insulating cover covering said semiconductor element; and (e) electrodes led out of said semiconductor element to an outside of said insulating cover.

3. A semiconductor device according to claim 1, wherein said back electrode is thicker than said front electrode.

4. The semiconductor device according to claim 2, wherein said back electrode is thicker than said front electrode.

5. A semiconductor device according to claim 1, wherein said base plate is made of a plastic material.

6. A semiconductor device according to claim 2, wherein said base plate is made of a plastic material.

7. A semiconductor device according to claim 3, wherein said base plate is made of a plastic material.

8. A semiconductor device according to claim 4, wherein said base plate is made of a plastic material.

9. A semiconductor device according to claim 2, wherein said base plate is formed integrally with said insulating cover.

10. A semiconductor device according to claim 4, wherein said base plate is formed integrally with said insulating cover.

11. A semiconductor device according to claim 6, wherein said base plate is formed integrally with said insulating cover.

12. A semiconductor device according to claim 1, wherein said base plate has a plurality of through holes and said insulation substrate includes a plurality of insulation substrates, and wherein said plurality of insulation substrates each having said semiconductor elements fixed thereon are placed in the respective through holes.

13. A semiconductor device according to claim 2, wherein said base plate has a plurality of through holes and said insulation substrate includes a plurality of insulation substrates, and wherein said plurality of insulation substrates each having said semiconductor elements fixed thereon are placed in the respective through holes.

14. A semiconductor device according to claim 3, wherein said base plate has a plurality of through holes and said insulation substrate includes a plurality of insulation substrates, and wherein said plurality of insulation substrates each having said semiconductor elements fixed thereon are placed in the respective through holes.

15. A semiconductor device according to claim 5, wherein said base plate has a plurality of through holes and said insulation substrate includes a plurality of insulation substrates, and wherein said plurality of insulation substrates each having said semiconductor elements fixed thereon are placed in the respective through holes.

16. A semiconductor device according to claim 9, wherein said base plate has a plurality of through holes and said insulation substrate includes a plurality of insulation substrates, and wherein said plurality of insulation substrates each having said semiconductor elements fixed thereon are placed in the respective through holes.

17. The semiconductor device according to claim 1, wherein said base plate is divided into a plurality of segments and a plurality of through holes are formed by arrangement of the plurality of segments.

18. A semiconductor device according to claim 17, wherein said insulation substrate includes a plurality of insulation substrates, and wherein said plurality of insulation substrates each having said semiconductor elements fixed thereon are placed in the respective through holes.

19. A semiconductor device comprising:

(a) base plate means extending in a longitudinal direction and including a through hole through the portion extending in the longitudinal direction;

(b) insulating substrate means including a front electrode means and a back electrode means bonded into said insulator substrate means, said front electrode means for supporting a semiconductor element and said back electrode means for fixing said insulator substrate means to said base plate means; and (c) through hole means in said base plate means for internally receiving said insulator substrate means.

20. A semiconductor device according to claim 19, further comprising:

(d) covering means for covering said insulation substrate; and (e) electrical connection means for electrically connecting to said semiconductor element through said covering means.

* * * * *